United States Patent [19]
Sadigh-Behzadi

[11] Patent Number: 4,815,982
[45] Date of Patent: Mar. 28, 1989

[54] ELECTRICAL CONNECTOR HAVING STRESS-FREE CONTACTS

[75] Inventor: Amir-Akbar Sadigh-Behzadi, Van Nuys, Calif.

[73] Assignee: Thomas & Betts Corporation, Bridgewater, N.J.

[21] Appl. No.: 86,433

[22] Filed: Aug. 18, 1987

[51] Int. Cl.[4] .............................................. H05K 1/00
[52] U.S. Cl. .................................... 439/82; 439/382; 439/908
[58] Field of Search ................. 439/382, 383, 384, 55, 439/56, 59, 66, 78, 80, 81, 82, 83, 84, 874, 876, 907, 474, 475, 908

[56] References Cited

U.S. PATENT DOCUMENTS

| | | | |
|---|---|---|---|
| 2,072,952 | 3/1937 | Jones | 250/27.5 |
| 2,741,751 | 4/1956 | Weiler | 439/82 |
| 3,380,016 | 4/1968 | Samson et al. | 439/382 |
| 3,950,068 | 4/1976 | Schmieg | 339/176 |
| 4,168,879 | 9/1979 | Ohtsuki et al. | 339/258 |
| 4,324,451 | 4/1982 | Ammon et al. | 339/176 |
| 4,410,230 | 10/1983 | San Miguel | 339/176 |
| 4,470,648 | 9/1984 | Davis et al. | 339/14 |
| 4,533,203 | 8/1985 | Feldman et al. | 339/176 |
| 4,541,034 | 9/1985 | Fanning | 439/83 |
| 4,555,153 | 11/1985 | Bricaud et al. | 439/81 |
| 4,568,136 | 2/1986 | Reüss | 339/176 |
| 4,654,753 | 3/1987 | Turk et al. | 439/82 |

Primary Examiner—David Pirlot
Attorney, Agent, or Firm—Robert M. Rodrick; Salvatore J. Abbruzzese

[57] ABSTRACT

An electrical connector having stress-free resiliently deformable contacts is shown. The connector includes a plurality of elongate contacts having first and second opposed ends. Movement is permitted between respective ends by incorporating a plurality of independently resiliently deformable transition regions in the contacts between the ends thereof. These transition regions permit the contacts to be movable in three dimensions without placing undue stress on either the contact or the fixed terminal ends.

8 Claims, 2 Drawing Sheets

4,815,982

ELECTRICAL CONNECTOR HAVING STRESS-FREE CONTACTS

FIELD OF THE INVENTION

This invention relates generally to an electrical connector for securement to a printed circuit board and more particularly relates to an electrical connector having electrical contacts therein which may be secured to a printed circuit board to provide stress-free resilient movement between the connector and the printed circuit board.

BACKGROUND OF THE INVENTION

In order to make electrical termination to a printed circuit board, the art has developed various electrical connectors which are mountable to the printed circuit board and provide connection capabilities for external components. Typical of these devices are electrical connectors having an insulative housing with plural electrical contacts extending therethrough. These contacts include terminal portions which extend externally of the insulative housing and are insertable into through-holes in the printed circuit board. These terminal portions may be soldered or otherwise secured to the printed circuit board to provide mechanical and electrical connection. Many of these connectors are of the type known as right angle connectors having contacts which are bent at a 90° angle so that external connection may be made to the printed circuit board in a direction parallel to the plane of the printed circuit board.

A connector of this type is shown and described in U.S. Pat. No. 4,410,230. As is typical of these right angle connectors, the connector is seated directly on the printed circuit board. However, there is also a need to provide a right angle electrical connector which may be positioned above the surface of the printed circuit board. These connectors include extended right angle contacts which make connection to the printed circuit board with the connector housing itself being raised thereabove. Connectors of this type allow for increased density of components on the printed circuit board, as valuable board real estate would not be occupied by the connector housing itself.

While providing certain advantages to designers of printed circuit board arrays, connectors of this type are subject to damage from external contact. Since the connector is secured to the printed circuit board only at the terminal portions of the contacts, inadvertent contact with the connector body could cause undue stress at the solder joints which may result in breakage or insufficient electrical contact thereat. Since the right angle contacts used in connectors of this type are rigid metallic members, any stress placed on the connector will be transferred to the solder joint thereby weakening or breaking the solder connection. It is also possible to permanently deform or even break a contact due to such movement. Thus it can be seen that special care must be taken when handeling printed circuit boards having such components mounted thereon.

It is therefore desirable to provide an electrical connector having contacts which will permit relative movement between the connector housing and the printed circuit board without placing undue stress on the solder joint or the contact itself.

SUMMARY OF THE INVENTION

It is an object of the present invention to provide an electrical connector for securement to a printed circuit board which would provide for relative movement between the connector and the printed circuit board.

It is a further object of the present invention to provide an electrical connector contact which will provide for stress-free movement between the two ends of the contact.

It is a still further object of the present invention to provide an electrical connector having right angle electrical contacts where one end of the contact is secured to a printed circuit board and the other end is supported in the housing of the connector and which would provide for relative movement between the connector housing and the printed circuit board without placing undue stress on the contact.

In the efficient attainment of these and other objects, the present invention provides an electrical connector for connection to a printed circuit board. The connector includes an insulative housing and a plurality of electrical contacts supported in the housing. Each of the contacts in the housing includes a first terminal portion extending externally of the housing for securement to through-holes of the printed circuit board. Each contact also includes a second terminal portion supported in the connector housing. A central portion of each contact includes plural deflection zones which are deflectable in different mutually orthogonal directions to permit relative movement between the insulative housing and the terminal portions fixed on the printed circuit board.

In a specific design shown by way of preferred embodiment, an electrically conductive element for use in a electrical connector is disclosed where the conductive element includes an elongate contact having a first connection end and an opposed second connection end. The contact includes plural independently resiliently deformable transition regions between the first and second connection ends. These plural transition regions, by such resilient deformation, permit relative movement between the first and second connection ends.

DETAILED DESCRIPTION OF THE PREFERRED EMBODIMENT

Figure 1:
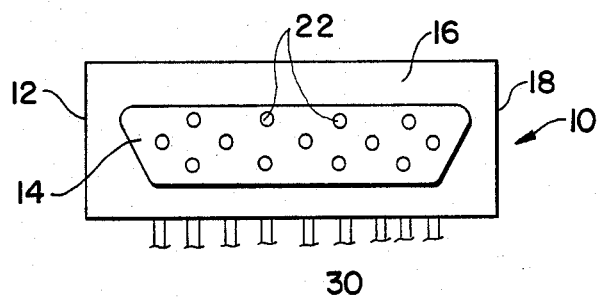
FIG. 1 is a front plan view of a right angle electrical connector which may be employed with the present invention.
Figure 2:
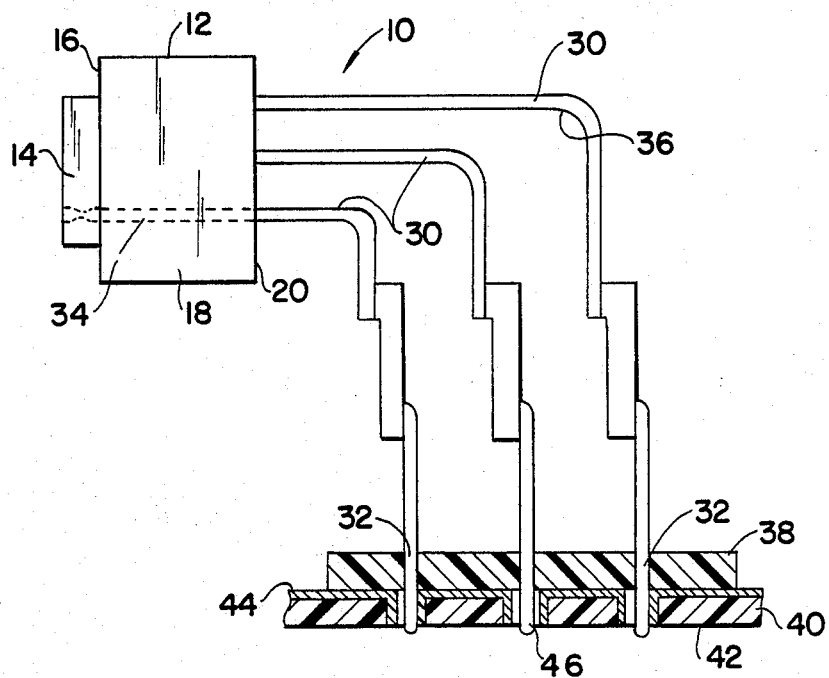
FIG. 2 is a side elevational showing, partially in section, of the electrical connector of the present invention supported on a printed circuit board.

Referring to FIGS. 1 and 2, an electrical connector 10 is shown. Connector 10 includes an electrically insulative connector housing 12 which may be formed of a suitably insulative plastic material such as polyester. Shown in FIG. 2, housing 12 includes a front mating portion 14 extending from a first major surface 16 and a rear contact accommodating portion 18 rearwardly adjacent to the mating portion 14. The contact accommodating portion 18 includes a second major surface 20 which is spaced from and opposed to first surface 16. Mating portion 14 of housing 12 may be formed into a conventional connection shape such as that shown in FIG. 1, which is known in the industry as a 'D' connector. The mating portion 14 includes plural access openings 22 which provide for electrical interconnection access to electrical connector 10. Openings 22 are provided in a one-to-one correspondence to electrical contacts which are supported in the housing as will be described in further detailed hereinbelow.

Referring still to FIGS. 1 and 2, supported in connector housing 12 are a plurality of electrical contacts 30. Contacts 30 are elongate members formed of electrically conductive metal having resilient characteristics. A preferred material used to form contacts 30 is a copper alloy. As particularly employed with the present invention, contacts 30 are of the right angle variety having a terminal tail 32 at one end thereof, a connection portion 34 at the other end and a central region 36 which is bent at a 90° angle. Thus the terminal tail 32 and the connection portion 34 are positioned orthogonally from one another. As shown in FIG. 2, the terminal tail 32 permits solder connection to the printed circuit board as will be described in detail hereinbelow. Further, connection portion 34 is supported in connector housing 12 and may be formed into a socket contact end for female receipt of a complementary pin type terminal. However, these end portions are shown only by way of example and any other terminal configuration may be employed with the present invention. Also, the contacts 30 may be provided in various lengths so that plural rows of contacts 30 may be employed in a single connector 10.

During use of connector 10 of the present invention, terminal tails 32 of each of the contacts 30 are disposed for connection with a printed circuit board 40. An insulative carrier 38 may also be disposed about the contact terminal tails 32 to maintain the tails in fixed relative position for connection to the pattern of through-holes 46 in printed circuit board 40. The printed circuit board 40 is of conventional construction having a body of insulative material 42 and a plurality of conductive traces 44 on the upper surface thereof. Through-holes 46 are included in the printed circuit board 40 and the conductive traces 44 extend into the through-holes 46. The terminals tails 32 of each of the contacts 30 are inserted into the through-holes 46 so that the terminal tails 32 may make electrical contact with the traces 44 extending into the through-holes 46. In order to mechanically and electrically secure the terminal tails 32 to the printed circuit board 40, solder (not shown) may be used in the through-holes 46. When properly positioned on printed circuit board 40, carrier 38 will be seated on the upper surface thereof. It can be seen that the terminal tails 32 are fixedly positioned in the through-holes 46 so that the contacts 30 and the connector housing 12 will be held in a given position relative to the printed circuit board 40.

Figure 3:
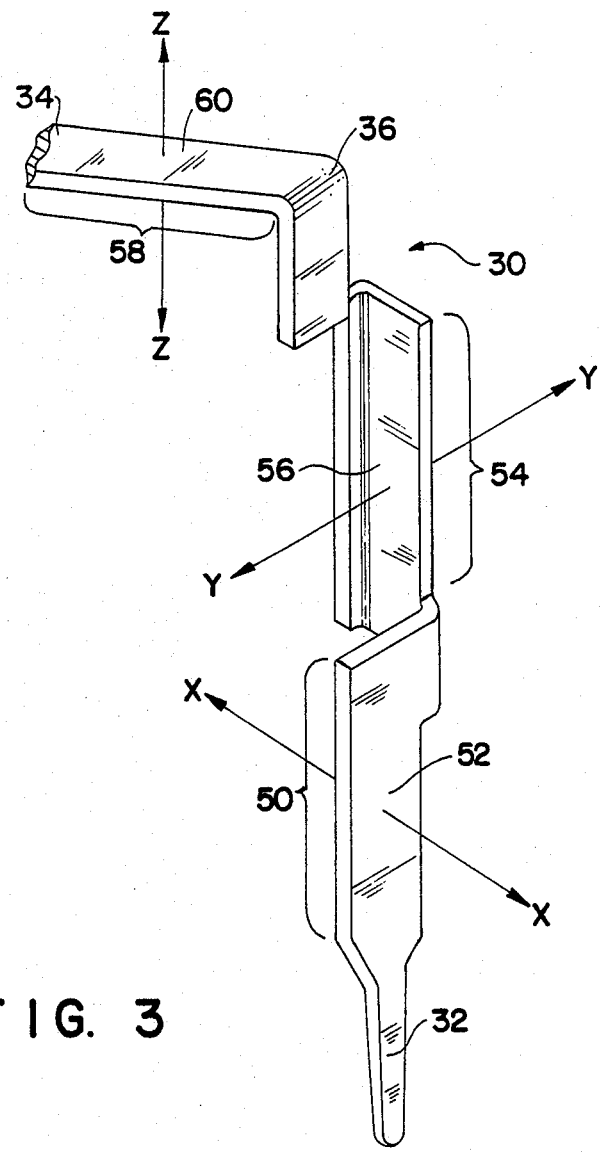
FIG. 3 is an enlarged perspective view, partially in section, of an electrical contact used in accordance with the present invention.

Referring additionally to FIG. 3, contact 30 may be described in greater detail. In order to permit relative movement between the fixed terminal tails 32 of contacts 30 and the insulative housing 12 supporting the connection portions 34 of contacts 30, the present invention provides a contact having plural deflectable transition zones therealong.

A first transition zone 50 is provided adjacent terminal tail 32. Transition zone 50 formed by a flat planar portion 52 at the lower end of contact 30. Transition zone 50 permits deflection of contact 30 about the terminal tail 32 in a direction normal to the plane of the transition zone 50. As shown in FIG. 3, deflection of contact 30 at transition zone 50 will be along the arrow X—X.

Contact 30 includes a second transition zone 54 above the first transition zone 50. The second transition zone 54 is defined by a flat planar portion 56. Flat planar portion 56 is disposed at a right angle to flat planar portion 52 of transition zone 50. Second transition zone 54 permits deflection of contact 30 thereat in a direction perpendicular to flat planar portion 56. The deflection direction of flat planar portion 56 is shown in FIG. 3 along the arrow Y—Y. Deflection of contact 30 in a direction of arrow Y—Y is perpendicular to the deflection along arrow X—X.

As shown in FIG. 3, contact 30 includes a bent extent at central region 36 above second transition zone 54. As above described, this places terminal tail 32 and connection portion 34 at a 90° orientation.

Connector 30 includes, adjacent connection portion 34, a third transition zone 58. Third transition zone 58 is formed of a flat planar portion 60 which due to the bent central region 36 is positioned perpendicular to both flat planar portion 52 and flat planar portion 56. Flat planar portion 60 permits deflection of contact 30 thereat in the direction of arrow Z—Z. Due to the construction of contact 30, arrow Z—Z is perpendicular to both of arrows Y—Y and X—X.

It can be appreciated that with terminal tail 32 fixed as shown in FIG. 2, the connection portion 34 of contact 30 may be moved relative thereto in three dimensions, along the direction of arrows X—X, Y—Y or Z—Z. Movement in such directions is accomplished by resilient deformation of contact 30 in the respective transition zones 50, 56 and 58. These transition zones provide for such movement without placing undue stress on the terminal tail 32 and its solder connection to the printed circuit board 40.

Referring again to FIG. 2, connector housing 12 will upon impact or inadvertent contact be able to move in three dimensions due to resilient deformation of the contacts 30 in the respective transition zones. Neither the solder joint nor the contact 30 itself will be subject to undue stress upon such movement.

Various changes to the foregoing described and shown structures would now be evident to those skilled in the art. Accordingly, the scope of the invention is set forth in the following claims.

I claim:

1. An electrical connector for a connection to a printed circuit board comprising:

an insulative housing having opposed major surfaces; and a plurality of electrical contacts supported in said housing, each of said contacts having a first terminal portion disposed for connection access adjacent one of said opposed major surfaces, a central portion extending beyond the other one of said major housing surfaces, and a second terminal portion for connection in a fixed position on said printed circuit board, said central portion of each of said contacts being continuous and including a first deflection zone being deflectable in a first direction, a second deflection zone continuous with but spaced from said first deflection zone and being deflectable in a second direction, and a third deflection zone continuous with but spaced from said second deflection zone and being deflectable in a third direction, each of said first, second and third directions being mutually different to permit relative movement between said housing and said fixed terminal portions of said plurality of contacts.

2. An electrical connector of claim 1 wherein each of said deflection zones includes a flat planar extent, each deflection zone being deflectable in a direction normal to said planar extent.

3. A connector of claim 1 wherein said contact is formed of a resiliently deformable metal.

4. An electrical connector of claim 1 wherein said first, second and third directions are mutually orthogonally different.

5. An elongate electrical contact comprising:
a first connection end, an opposed second connection end and an elongate continuous deflectable section between said first and second ends;
said elongate continuous deflectable section including a first transition region being deflectable in a first direction, a second transition region being deflectable in a second direction different from said first direction, and a third transition region being deflectable in a third direction different from said first and second direction thereby permitting three-dimensional relative movement between said first connection end and said second connection end.

6. A conductive element of claim 5 wherein one of said connection ends is a solder tail for connection to through-holes of a printed circuit board.

7. A conductive element of claim 5 wherein each of said plural transition regions includes an elongate member comprising a flat planar extent, said flat planar extent of one of said transition regions being disposed in a plane perpendicular to each of the planes of said other flat planar extents of said other transition regions.

8. A conductive element of claim 7 wherein each of said plural transition regions is resiliently deformable in a direction perpendicular to said plane of said flat planar extent.

* * * * *